United States Patent [19]
Weber et al.

[11] Patent Number: 6,128,195
[45] Date of Patent: Oct. 3, 2000

[54] TRANSFER MOLDED PCMCIA STANDARD CARDS

[75] Inventors: Patrick O. Weber, San Jose; Michael A. Brueggeman, Mountain View, both of Calif.

[73] Assignee: Hestia Technologies, Inc., Sunnyvale, Calif.

[21] Appl. No.: 08/972,845

[22] Filed: Nov. 18, 1997

[51] Int. Cl.[7] .............................. H05K 1/14; H05K 5/00; H01L 23/02
[52] U.S. Cl. ...................... 361/737; 361/736; 361/752; 361/758; 257/679; 439/946; 264/272.11
[58] Field of Search .................... 361/728, 736, 361/737, 752, 758; 257/679; 235/492; 439/946; 264/272.11

[56] References Cited

U.S. PATENT DOCUMENTS

| | | |
|---|---|---|
| 3,838,094 | 9/1974 | Sporck . |
| 4,043,027 | 8/1977 | Birchler et al. . |
| 4,305,897 | 12/1981 | Hazama et al. . |
| 4,460,537 | 7/1984 | Heinle . |
| 4,859,722 | 8/1989 | Shiobara et al. . |
| 5,132,778 | 7/1992 | Juskey et al. . |
| 5,164,144 | 11/1992 | Rose ........................................ 264/511 |
| 5,166,864 | 11/1992 | Chitwood et al. . |
| 5,173,840 | 12/1992 | Kodai et al. . |
| 5,244,840 | 9/1993 | Kodai et al. . |
| 5,397,857 | 3/1995 | Farquhar et al. . |
| 5,502,892 | 4/1996 | Lein . |
| 5,510,959 | 4/1996 | Derstine et al. . |
| 5,570,272 | 10/1996 | Variot ...................................... 361/723 |
| 5,574,628 | 11/1996 | Persia et al. . |
| 5,689,137 | 11/1997 | Weber ..................................... 257/679 |
| 5,700,723 | 12/1997 | Barber ..................................... 438/118 |
| 5,717,573 | 2/1998 | Sakurai .................................... 361/737 |

OTHER PUBLICATIONS

Zbranek, Jr. "PCMCIA Process Development", *Circuits Assembly* (Mar. 1995) pp. 46–50.
Markstein, "Effective Shielding Defeats EMI", *Electronic Packaging & Production*, (Feb. 1995) pp. 76–80.
Anderson, *PCMCIA System Architecture* (1994) pp. 21–28, Mindshare, Inc., Richardson, TX.
Freiberger, "PCMCIA Testing and Final Assembly" *Circuits Assembly* (Mar. 1995) pp. 42–45.
Spraylat Corporation, sales brochure, Mt. Vernon, NY.
Methode Electronics, Inc. sales brochure, Chicago, IL (1994).
Berg Electronics, sales brochure (Aug. 1993).
Minico, sales brochure (1991).

*Primary Examiner*—Jayprakash N. Gandhi
*Attorney, Agent, or Firm*—Burns Doane Swecker & Mathis L.L.P.

[57] ABSTRACT

A transfer molded PC card standard or small form factor card electronic package includes a substrate that has an integrated circuit package thereon and an electrical connector along a side of the substrate. In addition, an upper cover extends over at least a portion of the substrate and the electrical connector. A lower cover extends over at least a portion of the substrate and the electrical connector and a transfer molded encapsulant covers the substrate and a portion of the upper cover and the lower cover. The portion of the upper cover and the lower cover are covered by the encapsulant and includes a first flange attached to a portion of a periphery of the upper cover and a second flange that is attached to a portion of the periphery of the lower cover.

6 Claims, 13 Drawing Sheets

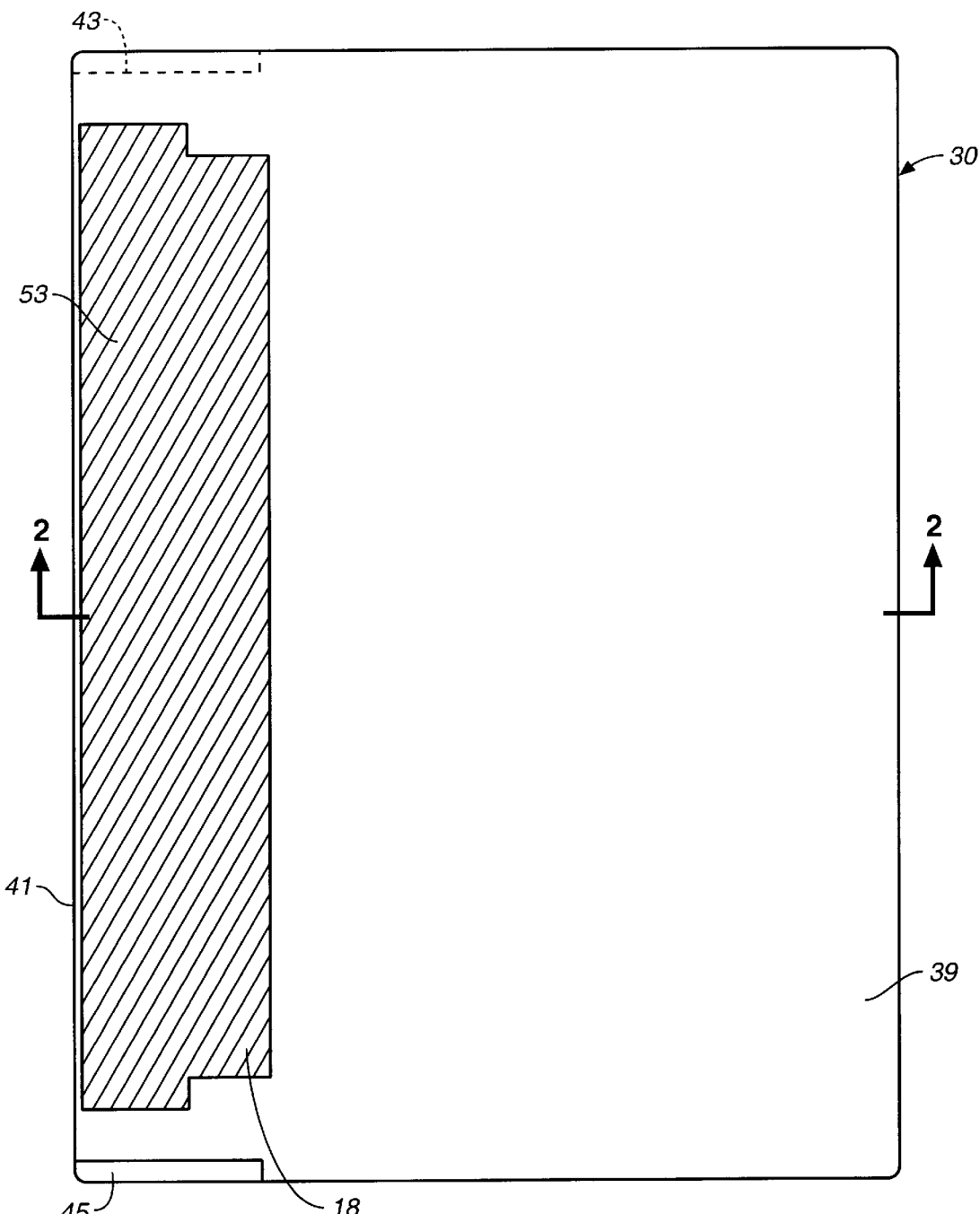
FIG._1

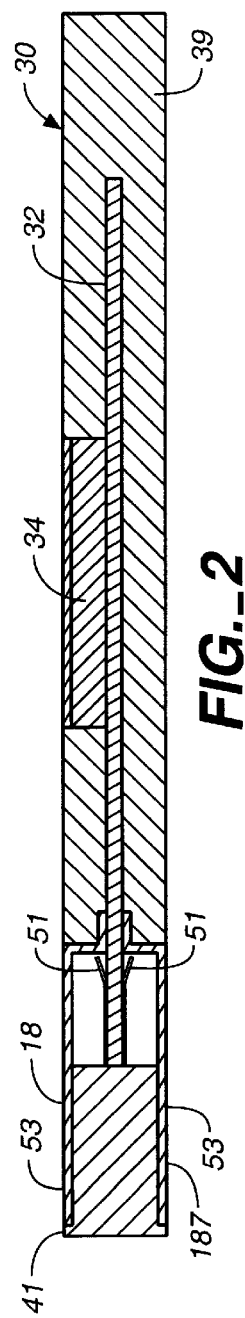
FIG._2
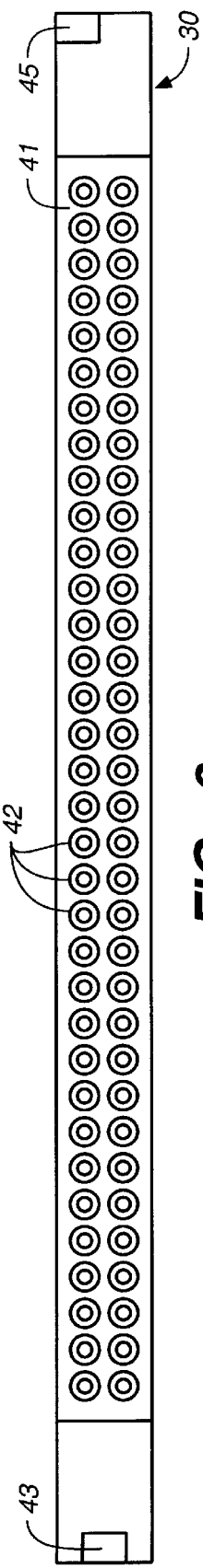
FIG._3

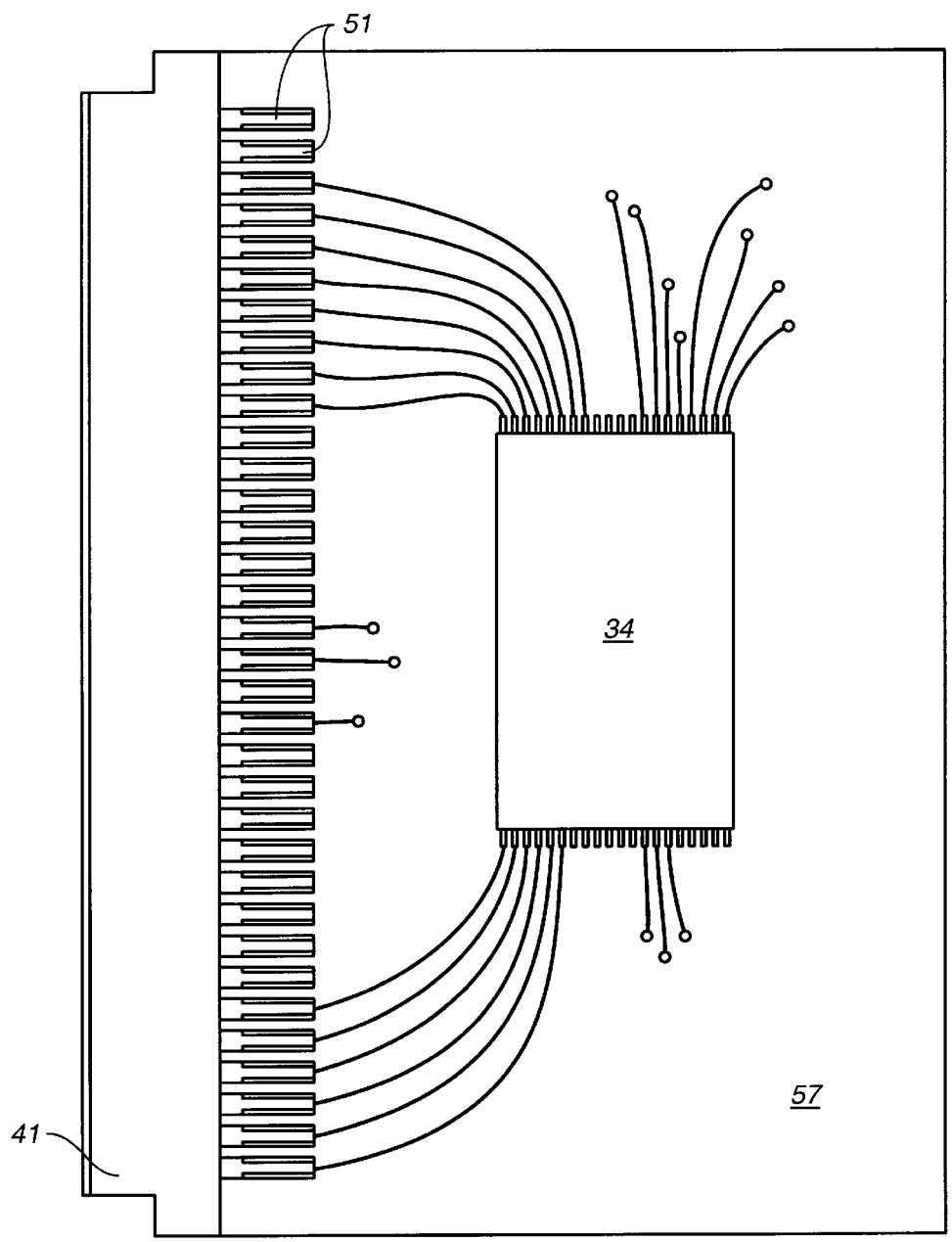
FIG._4
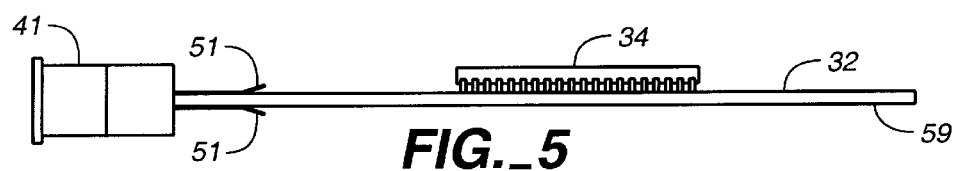
FIG._5

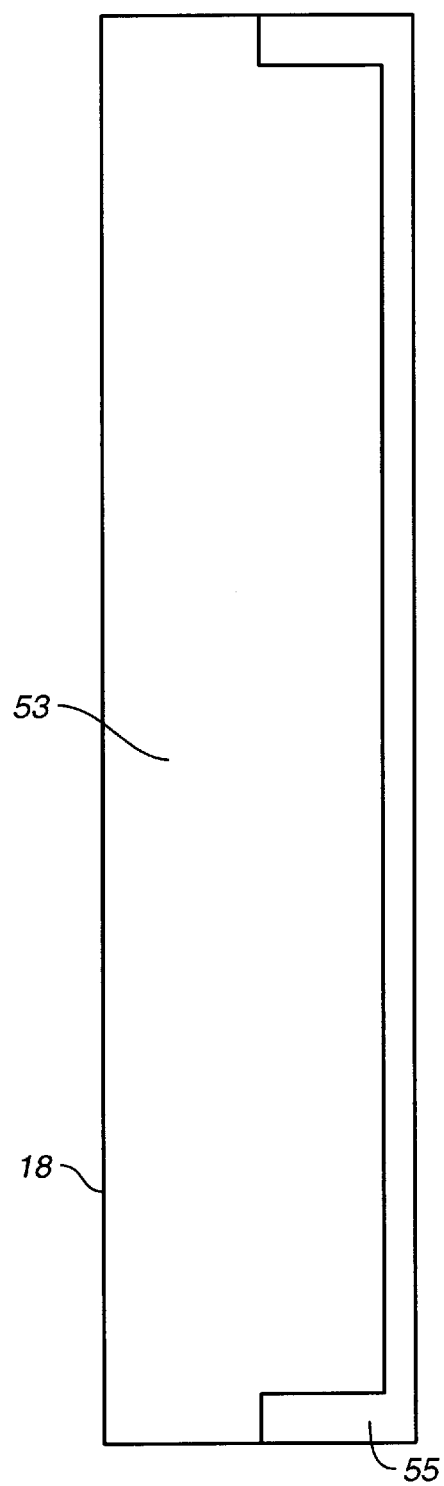
FIG._6
FIG._7

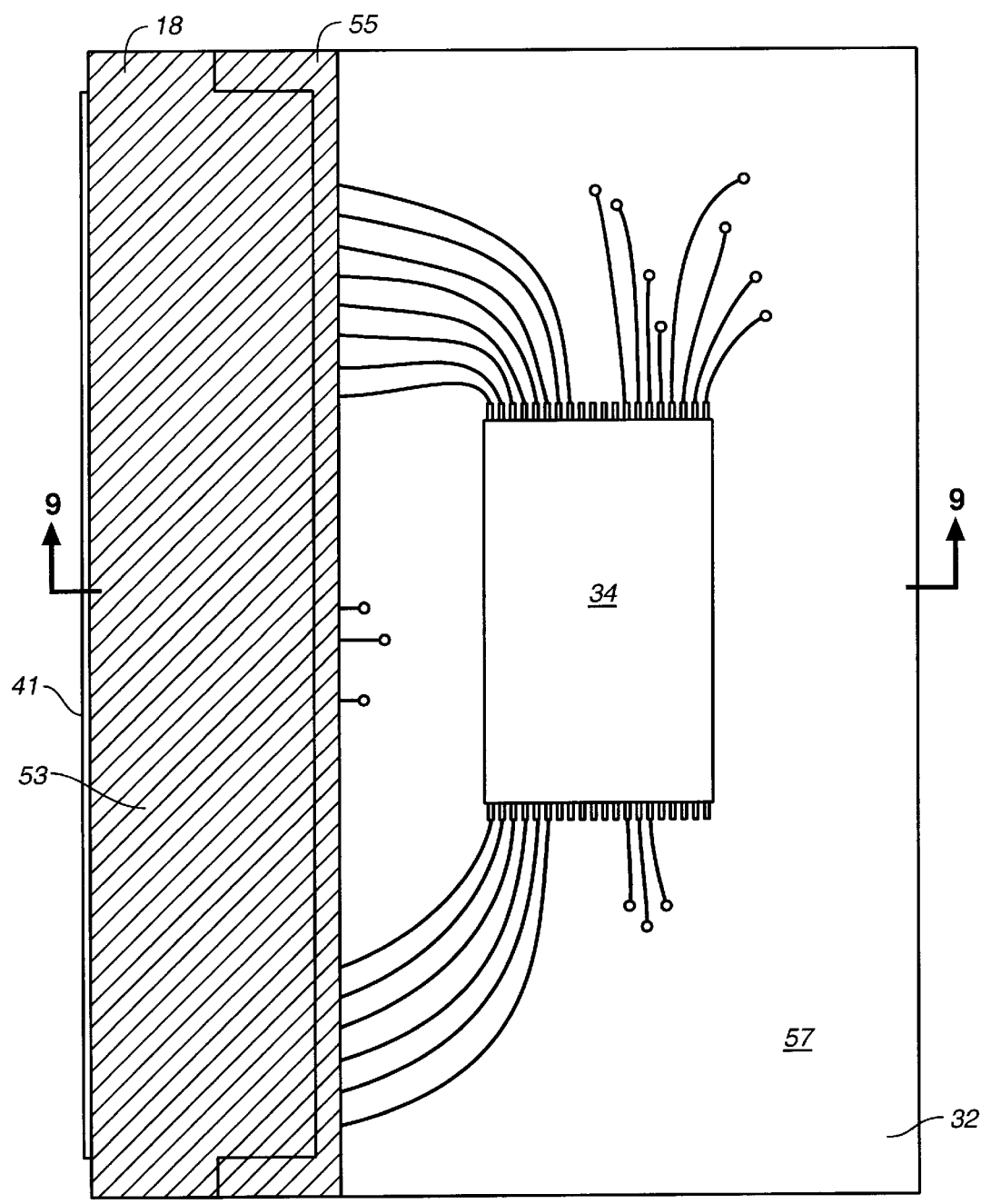
FIG._8

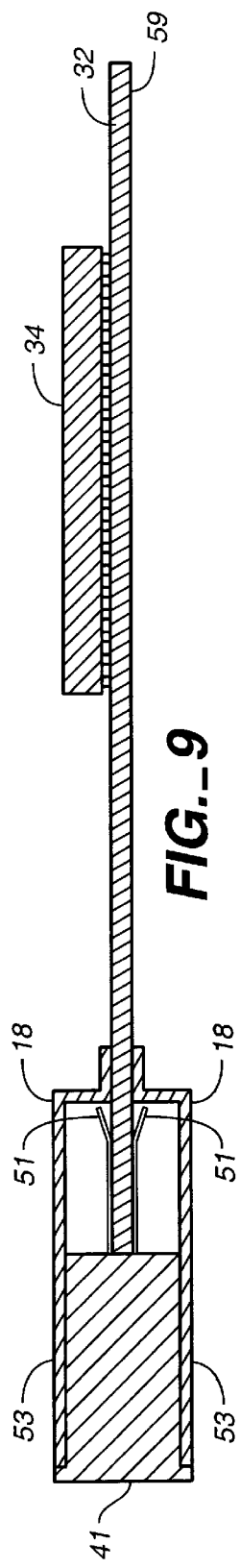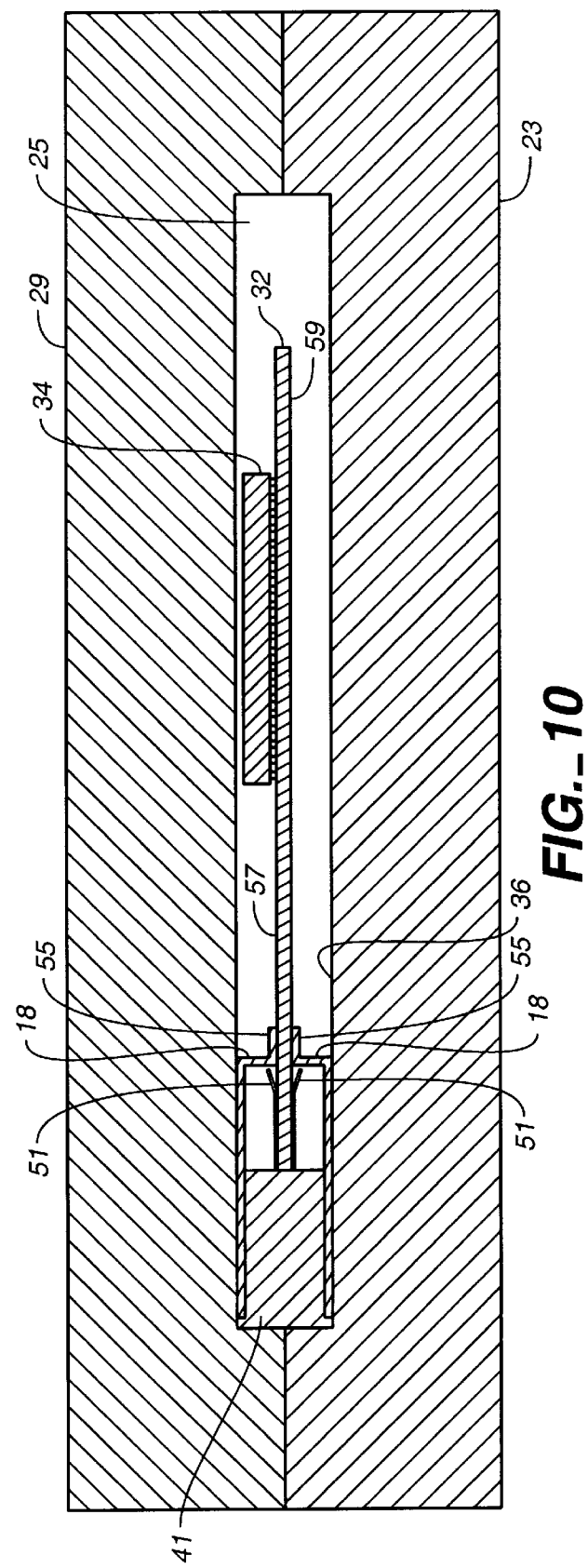

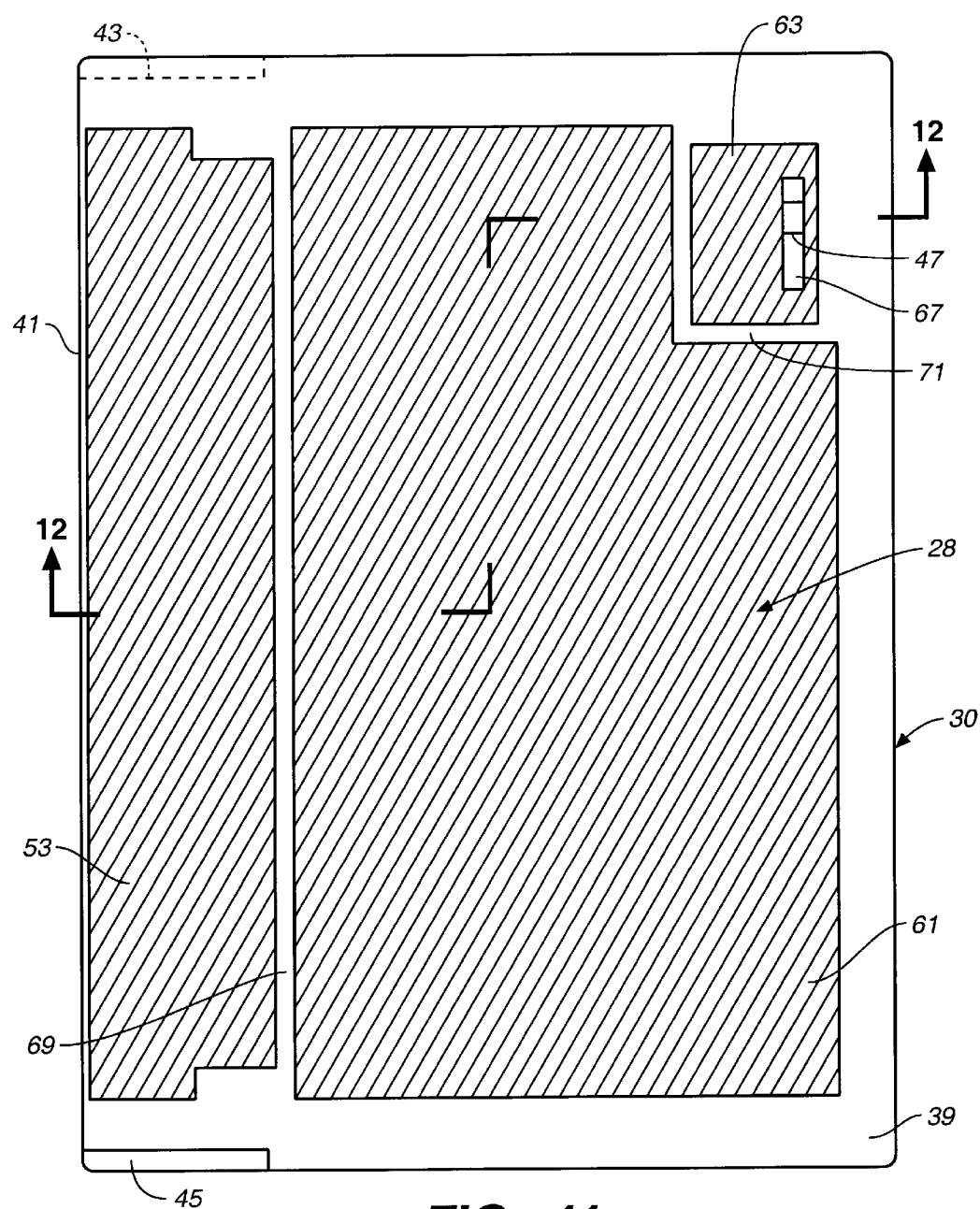
FIG._11

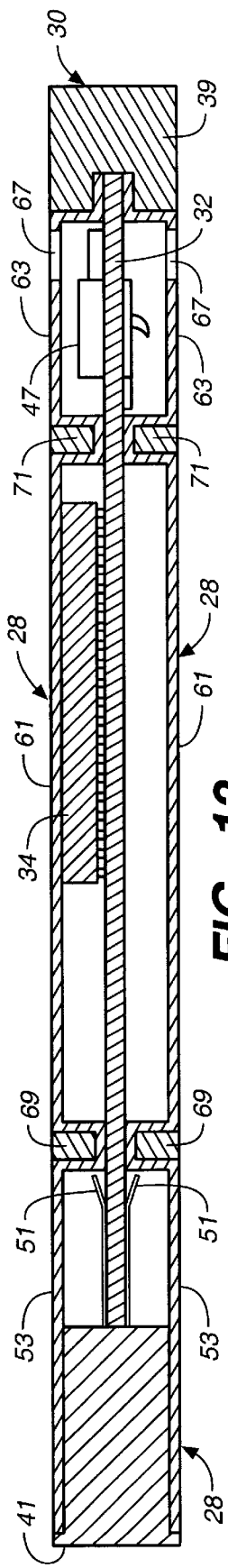
FIG._12

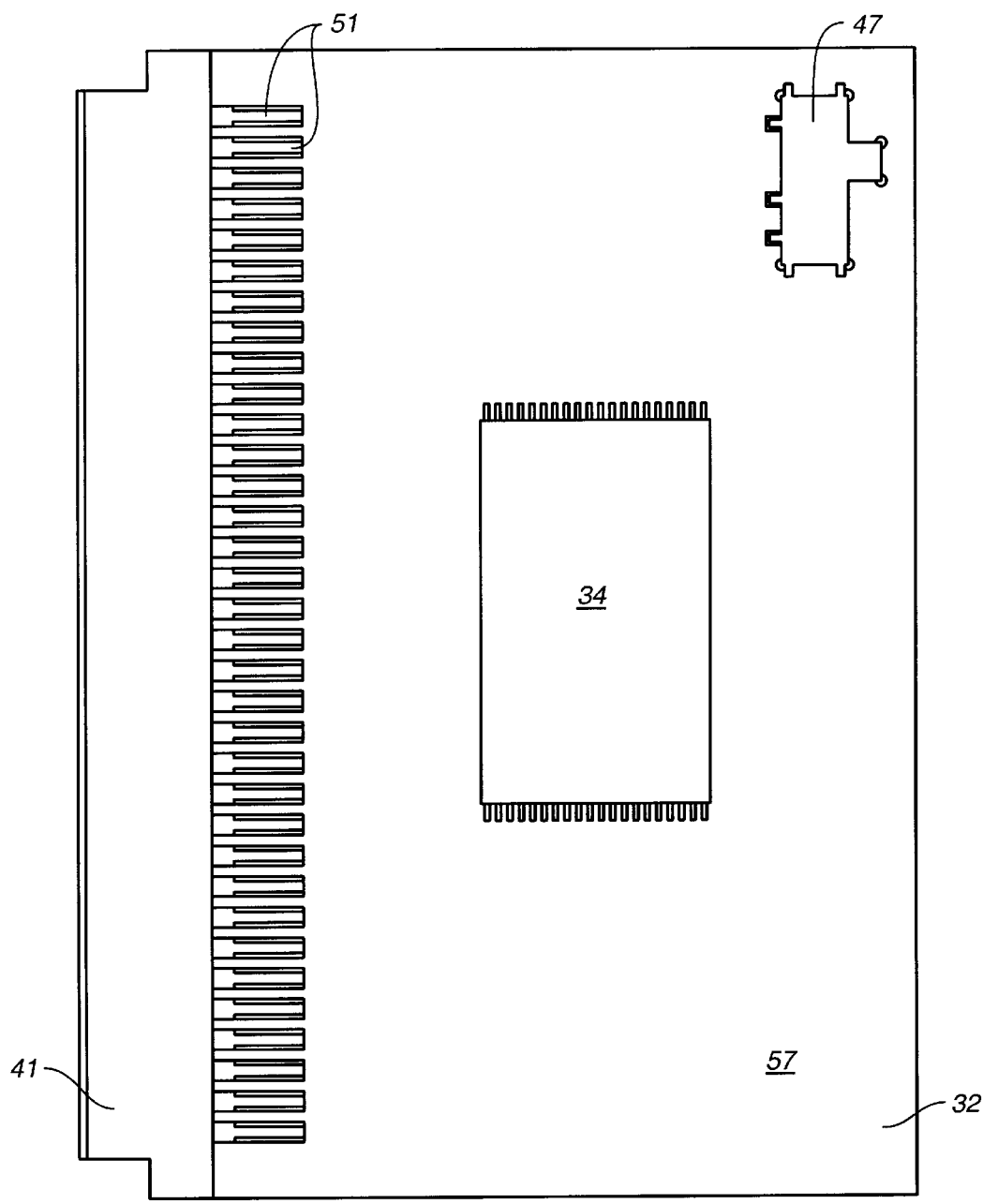
FIG._13
FIG._14

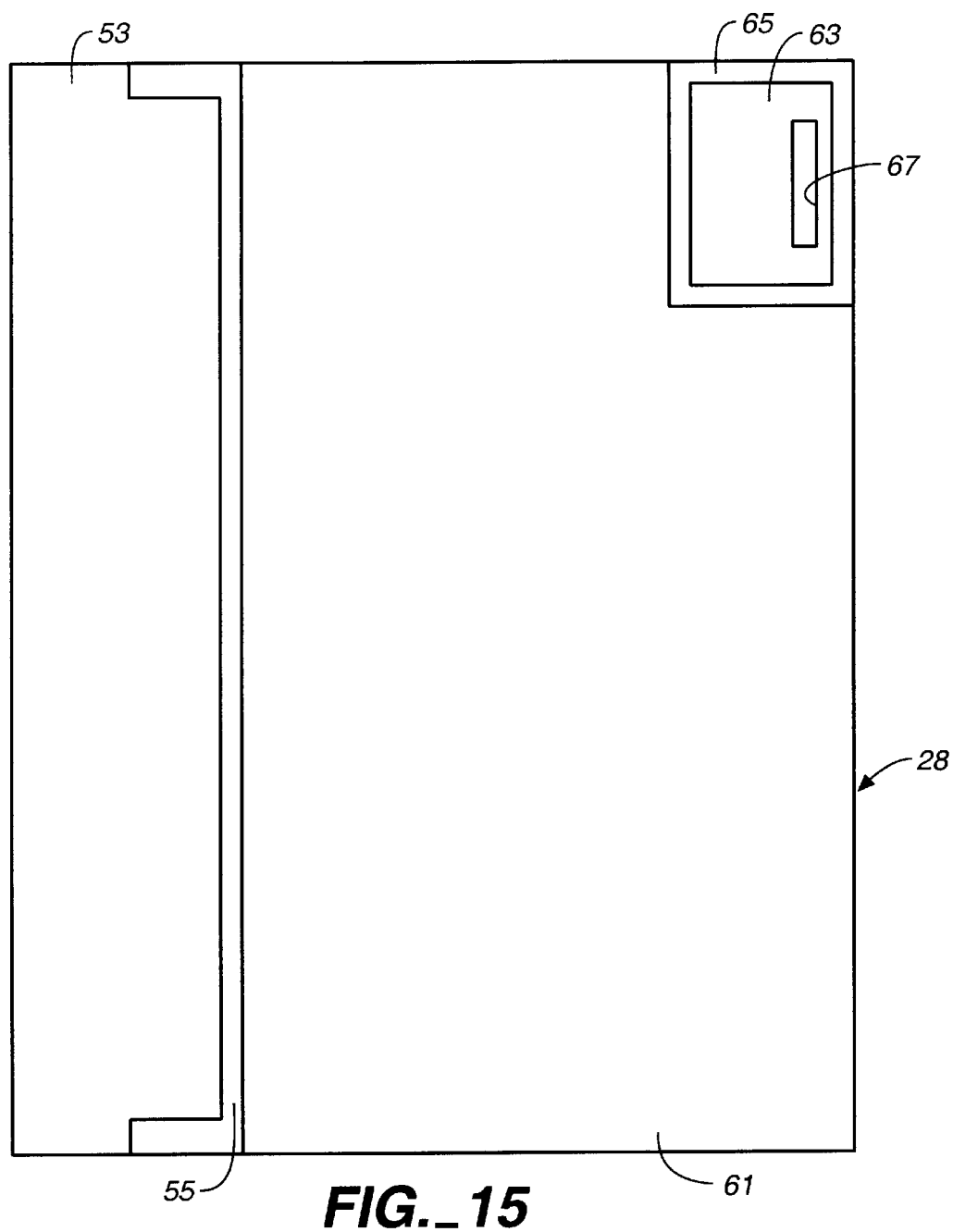
FIG._15
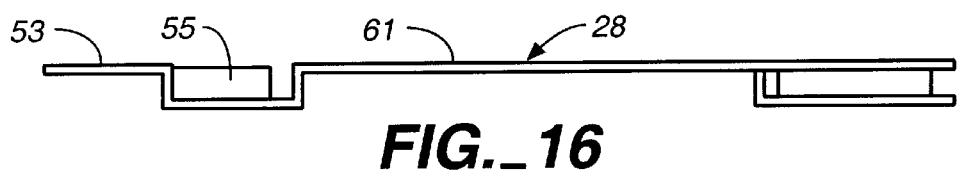
FIG._16

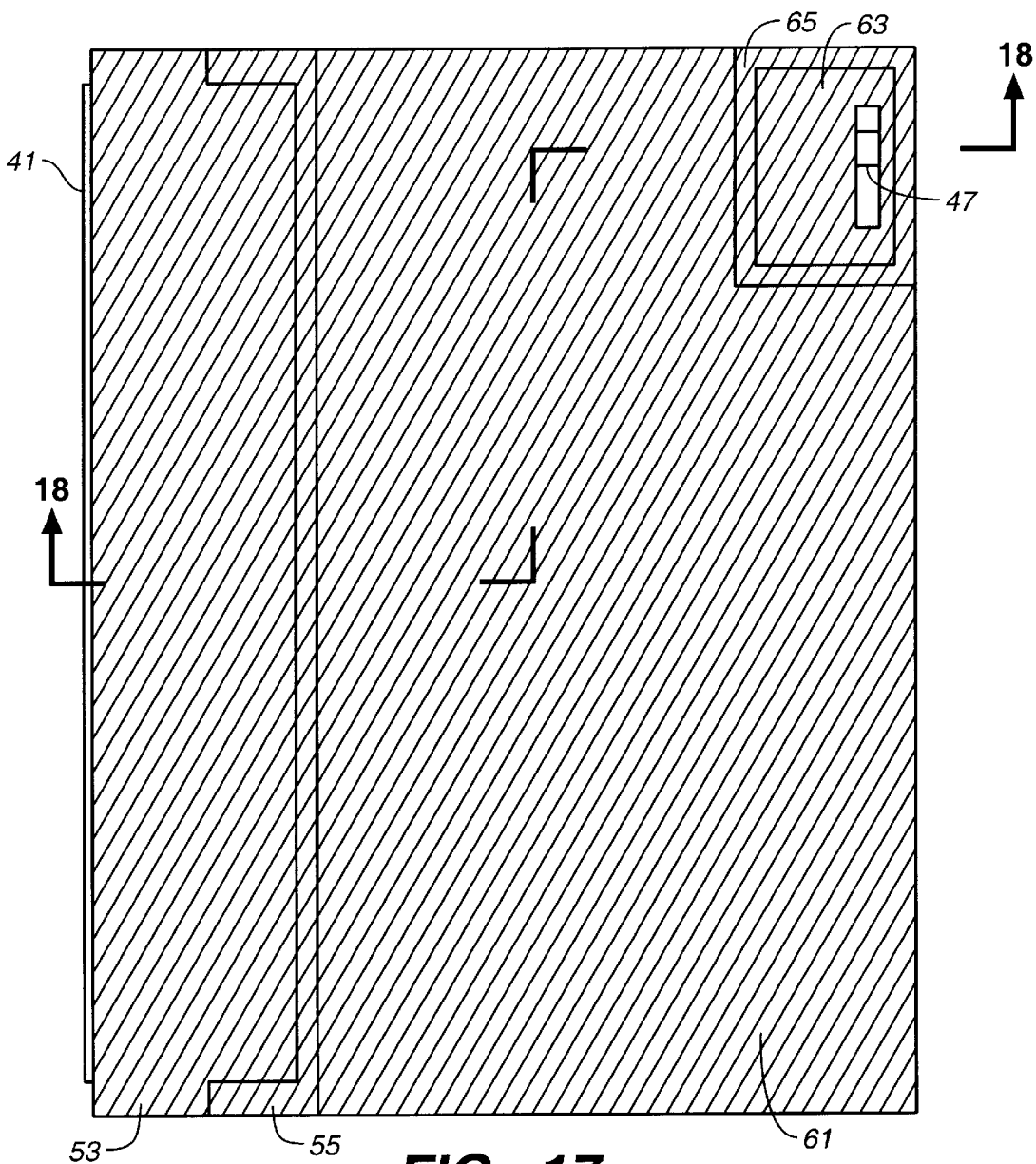
FIG._17

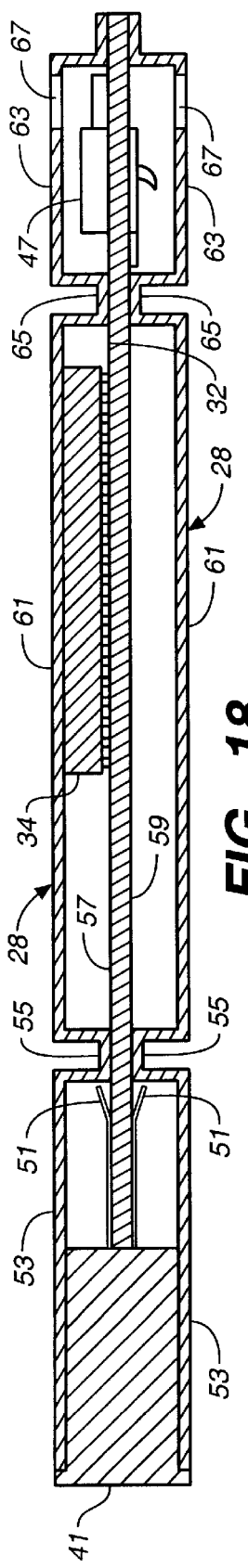
FIG._18
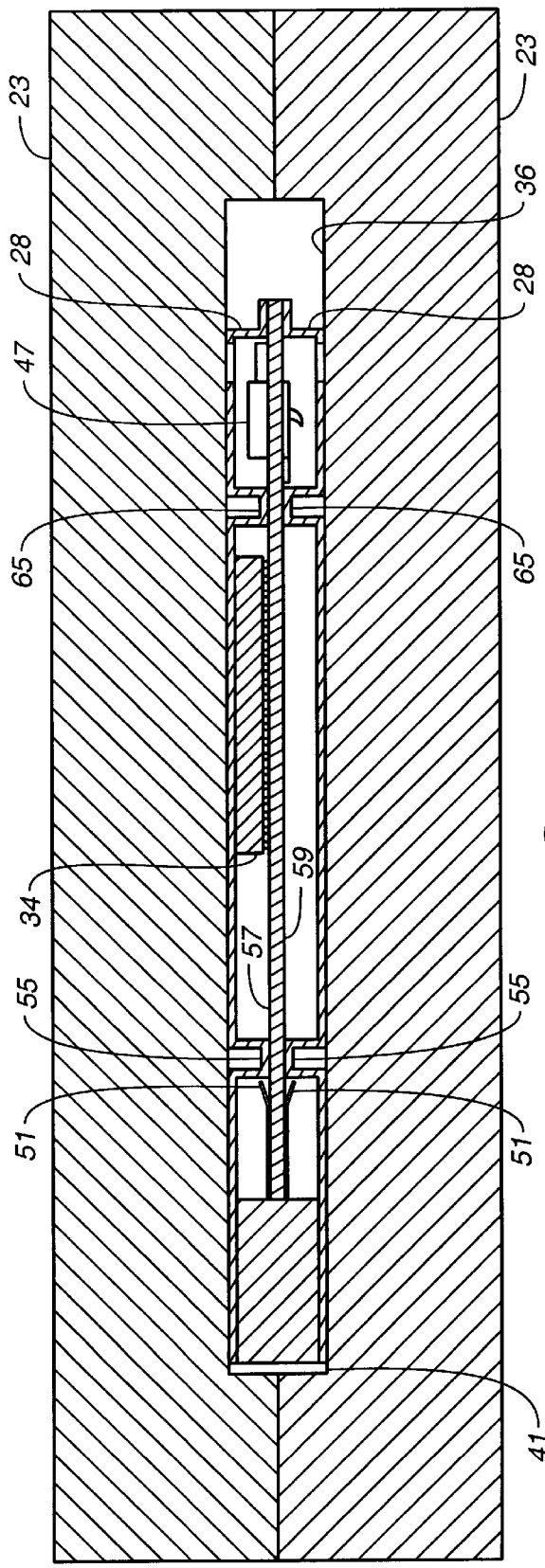
FIG._19

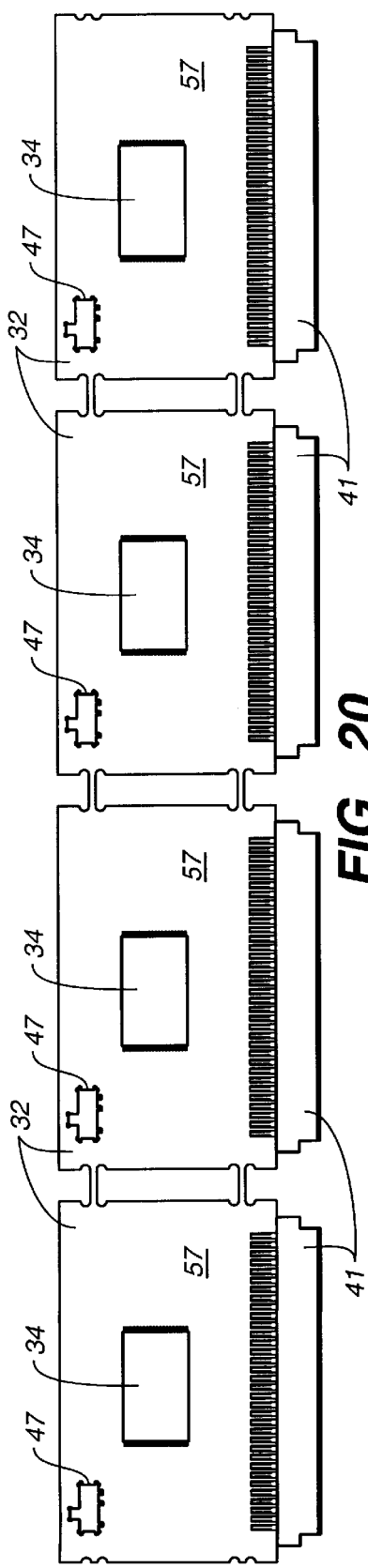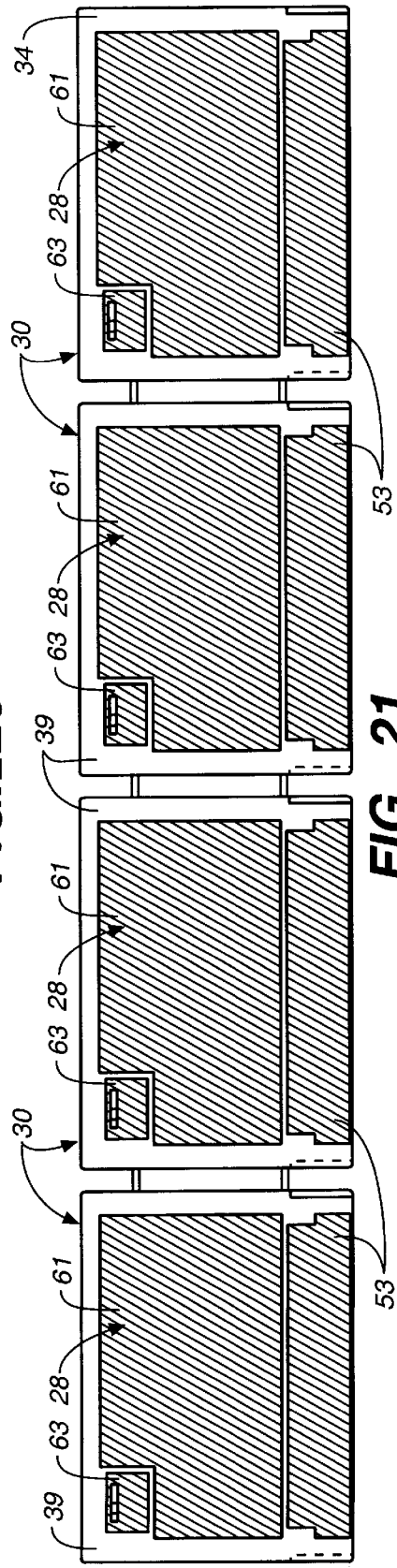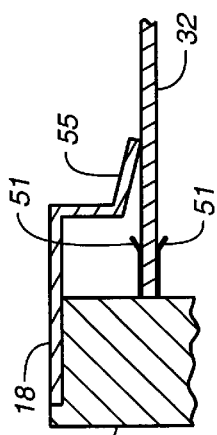
FIG._20  FIG._21  FIG._22

TRANSFER MOLDED PCMCIA STANDARD CARDS

BACKGROUND OF THE INVENTION

This invention relates in general to improved methods for producing standard PCMCIA electronic packages (i.e., PC cards) or small form factor electronic packages and the cards produced thereby.

The Personal Computer Memory Card International Association (PCMCIA) is a standards body composed of more than 300 member companies. PCMCIA has developed standard sized electronic packages for personal computers cards (i.e., PC cards). A PC card is standardized in size for use in personal computers, personal communicators, and other electronic devices. PC cards are used to provide additional memory, storage, communication and input/output (I/O) capabilities, especially for portable systems.

PCMCIA standards describe the physical requirements, electrical specifications and software architecture for PC cards. The standards define three physical sized cards: Type I, Type II and Type III. The thickness is the only difference between the three types. The thicknesses for Type I, Type II and Type III are 3.3, 5.0 and 10.5 millimeters, respectively. All three types use a standard 68 position connector for connecting to the computer or other device.

There are various methods of producing each of the different sizes of PC cards. Each method consists essentially of producing a printed circuit board or substrate with electronic components thereon. Attaching a frame around the printed circuit board and applying covers (or lids) on either side of the printed circuit board. If the PC card uses the single 68 position connector, the printed circuit board simply slips into the frame, and the connector locks in place. If the PC card also has a "back end" connector. Typically, the "back end" connector is attached to the frame and then attached to the printed circuit board using a soldering process.

A ground clip is typically attached either to the side of the frame to ground the PC card to the computer's internal ground or is attached to the printed circuit board. Two metallized covers are attached to the printed circuit board-frame assembly (one on each side) to protect the electronic components therein.

The most common cover type is the adhesive-backed metal lid. A press applies both heat and pressure to attach the cover to the frame. The covers must be hand-aligned on the assembly and placed into the press at about 120° C. for 20 seconds under pressure. The unit is then allowed to cool in the press to prevent cold flow or lifting of the cover from the frame. The total process time for this assembly is typically 180 seconds. Typically, springs are placed between the lids and the printed circuit board to prevent electromagnetic interference (EMI) problems.

Another type of lid is the staple lid, which is a cover with metal tabs for protruding through the frame. The tabs are typically crimped around the frame. Assembly is simple but requires a die and press. The two covers are hand-aligned on the frame. The assembly is the placed into the press, pressure applied and the crimps made. The attachment process is around 60 seconds but the tooling cost is higher than the adhesive-backed metal lids because of the cost of the die set.

Another type of cover is the injection-molded frame/cover combination. This method involves injection-molding a frame around the edges of a top cover and injection-molding a frame around the edges of a bottom cover, thus eliminating the frame as a component separate from each of the covers. The two frame/cover assemblies are placed on opposite sides of the printed circuit board and ultrasonically welded together. Process time is around 30 seconds but the ultrasonic welding step is costly.

The final type is a "snap together" configuration. The covers are simply snapped together over the rails of the frame around the printed circuit board. Ground tabs are incorporated into the covers that are bent in such a manner as to contact pads on the printed circuit board without the need for soldering. The process time is around 20 seconds.

U.S. Pat. Nos. 5,173,840 and 5,244,840 issued to Kodai et al. disclose using a molded frame and placing a printed circuit board with electronic components thereon into the frame, then filling the space defined by the frame with resin to cover the surface of the printed circuit board.

There is a continuing need in the art for a high strength, cost-effective method for producing standard electronic packages meeting the requirements of the PCMCIA standards.

SUMMARY OF THE INVENTION

A substrate (i.e., printed circuit board) with an integrated circuit package and a connector along one side is prepared with commonly known techniques. A lower cover is placed in a lower mold platen. The substrate is placed on the lower cover and an upper cover is placed on the substrate. The upper mold platen is then placed over the lower mold platen so that the lower cover, substrate and upper cover are between the two mold platens in a mold cavity. The mold cavity is sized to meet the physical limitations of either a Type I, Type II or Type III PCMCIA standard or small form factor cards. The substrate and lower and upper covers are then encapsulated with a transfer-molding process to produce a solid, integrally molded PC card or small form factor card having significantly greater strength than conventional frame and lid PC cards or small form factor card.

In accordance with one embodiment of the present invention, there is provided a method for transfer molding a PC card standard or small form factor card electronic package, comprising the steps of placing an upper cover over at least a portion of a substrate having an integrated circuit package on a surface thereof and an electrical connector along a side of the substrate and a lower cover over at least a portion of the substrate and the electrical connector, placing the upper cover, lower mold cover and the substrate in a mold cavity between mold platens, and encapsulating the substrate and at least a portion of the upper cover and the lower cover by transferring fluid molding compound into the mold cavity.

In accordance with another embodiment of the present invention, there is provided a transfer-molded PC card standard or small form factor card electronic package, comprising a substrate having an integrated circuit package thereon and an electrical connector along a side of the substrate, a lower cover and upper cover over the connector and at least a portion of the substrate, and a transfer-molded encapsulant covering the substrate and at least a portion of the upper and lower covers.

BRIEF DESCRIPTION OF THE DRAWINGS

Many objects and advantages of the present invention will be apparent to those skilled in the art when this specification is read in conjunction with the attached drawings wherein like reference numerals are applied to like elements.

FIG. 1 is a top plan view of a frameless PC card standard electronic package in accordance with one embodiment of the present invention.

FIG. 2 is a cross-sectional view of the PC card of FIG. 1 taken along line 2—2.

FIG. 3 is a front elevational view of the PC card of FIG. 1.

FIG. 4 is a top plan view of the substrate with an integrated circuit package thereon and a connector along one side thereof.

FIG. 5 is a right side elevational view of the assembly of FIG. 4.

FIG. 6 is a top plan view of a cover in accordance with one embodiment of the present invention.

FIG. 7 is a right side elevational view of the cover of FIG. 6.

FIG. 8 is a top plan view of the cover of FIG. 6 located on the substrate of FIG. 4.

FIG. 9 is a cross-sectional view of the cover and substrate of FIG. 8 taken along line 9—9.

FIG. 10 is a cross-sectional view of the cover and substrate of FIG. 9 in a mold cavity.

FIG. 11 is a top plan view of a PC card standard electronic package in accordance with another embodiment of the present invention.

FIG. 12 is a cross-sectional view of the PC card of FIG. 11 taken along line 12—12.

FIG. 13 is a top plan view of the substrate with an integrated circuit package and switch thereon, and a connector along one side thereof.

FIG. 14 is a right side elevational view of the assembly of FIG. 13.

FIG. 15 is a top plan view of a cover for use with the assembly of FIG. 13.

FIG. 16 is a right side elevational view of the cover of FIG. 15.

FIG. 17 is a top plan view of the cover of FIG. 15 located on the substrate of FIG. 13.

FIG. 18 is a cross-sectional view of the cover and substrate of FIG. 17 taken along line 18—18.

FIG. 19 is a cross-sectional view of the cover and substrate of FIG. 18 in a mold cavity.

FIG. 20 is a top plan view of a plurality of assemblies of FIG. 13 connected together for batch processing prior to encapsulation.

FIG. 21 is a top plan view of a plurality of PC cards of FIG. 11 after encapsulation and prior to separation.

FIG. 22 is a cross-sectional view of an alternate embodiment of the present invention.

DETAILED DESCRIPTION OF THE PREFERRED EMBODIMENTS

A frameless PC card standard electronic package 30 (i.e., a PC card)(FIGS. 1–3) or a frameless small form factor card electronic package is made in accordance with the present invention by the transfer-molding methods disclosed herein to be in compliance with the PCMCIA standard or small form factor requirements. The PC card 30 is comprised of a transfer-molded body 39 around a printed circuit board substrate 32 (FIG. 2) so as to form a novel PC card electronic package wherein the support structure is formed last around the internal components. The transfer-molded body 39 is an integrally formed support structure across and around the substrate that has no separate members or components. In other words, the PC card of the present invention has no frame and lid construction or frame and encapsulant construction as does the prior art. In a first embodiment, attached to the front of the PC card 30 is a cover 18 on each side of the substrate 32 to enclose a standard sixty-eight electrical contact connector 41, such as part number 952-0368SM01-90 sold by Methode of Chicago, Ill. or part number 1756S1-2 sold by AMP of Harrisburg, Pa. attached along one side of the printed circuit board substrate 32. Openings 42 (FIG. 3) in the connector 41 are pin receptors aligned with the electrical contacts 51 attached to the substrate (discussed in more detail below). The connector 41 has the standard keyways 43 and 45 on each side in accordance with the PCMCIA standard to ensure proper mating and orientation with a personal computer socket in which the PC card 30 is inserted.

In the embodiment of FIGS. 1–10, the cover 18 is a small cover partially encapsulated by the encapsulant 39 and covering essentially just the connector 41 and its attendant electrical contacts 51 to protect and seal those components during the transfer molding operation. In the embodiment of FIGS. 11–21, the cover 28 is a large cover partially encapsulated by the encapsulant 39 and covering the connector 41 and the substrate 32 and its attendant components such as switch 47, as will be described more fully later, to protect and seal those components during the transfer molding operation. In this way, standard commercially available connectors and switches can be used in the transfer-molding operation of a PC card, rather than having to tool custom connectors or switches. The covers 18 and 28 are also an EMI and ESD protective cover which prevent electromagnetic radiation from being emitted from the package and prevent electrostatic discharge into the package 30. Covers 18 and 28 can be a variety of materials such as but not limited to a conductive polymer or conventional metal foil or plate. For example, the covers can be stamped and formed from copper, aluminum or stainless steel sheets.

With reference to FIGS. 2, 4 and 5, the starting element for the frameless PC card 30 in accordance with the present invention is a laminated substrate 32. Substrate 32 is a conventional printed wiring board (PWB or printed circuit board (PCB)), typically of the multi-layer variety (e.g., four or six layers). However, the substrate can be a single layer substrate up to any number of layers that fit within the physical limitations of the PCMCIA standards or small form factor requirements after molding. The substrate 32 includes a plurality of plated vias extending through the substrate which interconnect the multiple layers. An integrated circuit package 34 is attached to the upper surface 57 of the substrate 32. Multiple integrated circuit packages or components can be attached to the substrate depending on the type of PC card being produced (e.g., fax/modem or memory). A plurality of electrical contacts 51 (i.e., sixty-eight standard electrical contacts) are attached along one side of the substrate 32. Typically, thirty-four electrical contacts 51 are attached to the upper surface 57 along one side of the substrate 32 and thirty-four electrical contacts 51 are attached to the lower surface 59 along the side of the substrate 32. As one of ordinary skill in the art will recognize, a plurality of electrical contacts can be attached to the side opposite of the electrical contacts 51 of the substrate 32 to produce an external connector on the PC card as is commonly used in I/O cards.

The following are a couple of examples of embodiments of the present invention. Encapsulation of the substrate 32 and covers 18 (FIGS. 1–10) or 28 (FIGS. 11–21) is accomplished by a transfer molding process. In the transfer molding process, as one of ordinary skill in the art will recognize, a large number of substrates (FIG. 20) and corresponding covers are placed in an open multi-cavity mold (not shown), one substrate and two covers in each cavity. When the mold is closed the two mold portions, usually called "platens" or "halves", come together surrounding the substrates 32 and covers 18 or 28. The multiple cavities in the mold are connected by a tree-like array of channels (i.e., runners) to a central reservoir (i.e., pot) from which the plastic is fed. Usually, "gates" (i.e., constricted channels) are placed just at the entrance to each cavity to control the flow and injection velocity of the plastic into the cavity, and to permit easier removal of the plastic material which has solidified in the runners from the finished part.

In the transfer molding process, powdered or pelletized plastic is placed in the central reservoir and compressed by a ram. The mold and reservoir are usually hot. The combination of heat and pressure causes the plastic to liquify and flow through the runner-tree and gates into the individual mold cavities, where it subsequently hardens. The mold halves are then separated and the encapsulated parts are removed, separated and trimmed of excess plastic left in the runners and the gates.

As used herein the words "upper platen" and "lower platen" or "upper mold platen" and "lower mold platen" refer to the two separable portions of the mold used to define the enclosed mold cavity in which molding is to occur. The words "upper" and "lower" are used for ease of description and do not imply a required orientation in space, since the molds may be readily designed to operate in either top transfer (ram on top) or bottom transfer (ram on bottom) configurations without affecting their basic function. Each of the figures relating to the mold platens only show a single mold cavity and device in the transfer mold for ease of description. As discussed above, ordinarily a plurality of such cavities exist so that a relatively large number of devices can be simultaneously molded. Well known mold features such as ejector pins which facilitate removal of the finished part(s) are omitted for clarity. Those of ordinary skill in the art will recognize that such a feature and/or others may be used in practicing the invention.

In the first embodiment, lower platen 23 is placed in a mold press (not shown) and lower short cover 18 is placed in lower platen 23 (FIG. 10). Lower cover 18 contacts the inside surface 36 of lower platen 23. Covers 18 (FIGS. 6–8) have a raised portion 53 shaped to receive and house the connector 41 and its electrical contacts 51. Along a portion of the lower periphery of the raised portion 53 of lower cover 18 is a flange 55. Flange 55 contacts and supports substrate 32 in the mold. Cover 18 preferably is a metallic element (or metallic coated element) and attached to the internal ground (not shown) of the substrate 32 (e.g., by being located on a metallized pad). Upper cover 18, which is identical to lower cover 18, is placed over substrate 32, connector 41 and electrical contacts 51 such that connector 41 and electrical contacts 51 are housed by the upper and lower covers 18 and the covers form a seal with the substrate upper surface 57 and lower surface 59 and inside surfaces of the mold platens. One of ordinary skill in the art will recognize that it is equivalent and within the scope of the claims to place the lower and upper covers on the substrate and connector, then place that assembly in the mold cavity. Upper platen 29 is aligned over lower platen 23 so that mold cavity 25 is formed surrounding all of lower and upper covers 18, and substrate 32. FIGS. 10 and 19 show the lower cover, upper cover and substrate located between mold platens 23 and 29, which are employed in the transfer molding operation.

In the transfer molding operation, a predetermined volume of fluid (heated) molding compound at least sufficient to fill the net volume of mold cavity 25 is forced through a runner at approximately 500 psi. The molding compound is preferably a thermoset plastic. The molding compound can be any of a number of transfer molding materials known to one of ordinary skill in the art, including but not limited to those disclosed in Sporck, U.S. Pat. No. 3,838,094, Shiobara et al., U.S. Pat. No. 4,859,722, and Jusky et al., U.S. Pat. No. 5,132,778, all of which are incorporated herein by reference in their entirety.

The transfer molding process using the thermoset plastic is preferred over an injection molding process using a thermoplastic. The transfer molding process is performed at temperatures between 150–200° C. which does not harm the electronic components or reflow the soldered connections. Contrarily, the injection molding process is performed at temperatures above 300° C. which can harm electronic components and reflow the soldered connections.

The fluid molding compound passes into mold cavity 25 and flows over upper surface 57 and flange 55 of upper cover 18, and under lower surface 59 and flange 55 of lower cover 18 to encapsulate the flanges of the covers, the substrate and the integrated circuit package 34 to form frameless PC card 30. The molding compound forms a seal with the upper and lower covers 18. Flanges 55 are not present on the covers 18 in an alternate embodiment of the present invention. In addition, in another alternate embodiment of the present invention as shown in close-up in FIG. 22, the flange 55 can be angled slightly to form a spring flange that compensates for tolerances in the connector 41 and substrate 32.

It is important that the velocity at which the liquid molding compound is injected into the mold cavities be controlled so as not to exceed a maximum injection velocity. The limit on the maximum injection velocity is required in order to avoid forming voids in the molding compound, having the rapidly moving molding compound damage fragile elements of the device, or causing the substrate 32 to flutter up and down in the mold cavity 25. A spacer (not shown) contacting the upper and lower mold platens and the substrate, if used, can help to stabilize the substrate 10 during the molding process. The maximum injection velocity may be readily determined by experiment. It is also important that the injection molding time be less than the solidification time. This second requirement imposes a lower limit upon the injection velocity. In the transfer molding art, it is a good rule of thumb that the fluid molding compound will not flow into a gap or recess smaller than about 0.025 mm. Thus, vents can be provided having a diameter of about 0.01 mm to relieve air pressure within the mold while precluding the flow of molding compound therethrough.

The molded PC card 30 typically starts to cure in the mold. Then, the PC card 30 is removed from the mold and cured or cross-linked at about 175° C. for four hours. Curing is not necessary for all applications, some molding compounds do not need post mold curing. Likewise, mold curing may not be required for the particular product being molded. If the integrated circuit chips are not mounted directly to the substrates and/or already have a molded body around them, then no mold cure is required. Whereas if the integrated circuit chips are mounted directly to the substrate and/or without a molded body already around them, then mold curing is typically performed. The molding compound hardens into encapsulant 39 that surrounds the top surface, bottom surface and sides of substrate 32 except in the area that was sealed off by the covers 18. After the molded body 39 is hardened, the raised portion 53 of the covers 18 are exposed on the top and bottom of the encapsulant 39 as a result of being in contact with the surfaces of the top and bottom mold platens (FIG. 10).

The transfer molded body 39 of the present invention is an integrally formed housing and support structure that has superior strength compared to conventional frame and lid PC cards (i.e., a "can" card) of the prior art while being less expensive and easier to manufacture. A bend test comparison of a PC card in accordance with the present invention versus a "can" card was conducted to illustrate the advantages of the present invention. Each card was of standard PCMCIA width and 1.5 inches long. For the "can" card, initial cracking was heard at 10 lbs. of force. Additional cracking of the "can" card was heard at 15 lbs. of force. The "can" card was removed from the test apparatus. Permanent deformation was visible (i.e., the card was bent) and the test was discontinued. The same test was conducted on a PC card of the present invention. After 25 lbs. of force, no damage was visible and very little deflection occurred during the test as summarized in Table I.

TABLE I

Bend Test Comparison

| | Deflection (inches) | |
|---|---|---|
| Force (lbs.) | Invention | "can" card |
| 5 | 0.016 | 0.026 |
| 10 | 0.023 | 0.058 |
| 15 | 0.031 | 0.130 |
| 20 | 0.038 | n/a |
| 25 | 0.048 | n/a |

FIGS. 11–21 illustrate another embodiment of the present invention in which long covers 28 are used in place of the short covers 18 in order to provide greater ESD and EMI protection and protection for switch 47 during the transfer molding process. In this embodiment, the PC card electronic package 30 has a mold cover 28 on each side of the substrate 32 to enclose a standard sixty-eight electrical contact connector 41, such as part number 952-0368SM01-90 sold by Methode of Chicago, Ill. or part number 1756S1-2 sold by AMP of Harrisburg, Pa. attached along one side of the printed circuit board substrate 32 and to enclose a standard electrical switch 47, such as part number MM1200S sold by Augat, Inc. of Attleboro Falls, Mass.

In the present embodiment, lower platen 23 is placed in a mold press (not shown) and lower long cover 28 is placed in lower platen 23 (FIG. 19). Lower cover 28 contacts the inside surface 36 of lower platen 23. Covers 28 (FIGS. 15–18) have a raised portion 53 shaped to receive and house the connector 41 and its electrical contacts 51. Along a portion of the lower periphery of the raised portion 53 of cover 28 is a flange 55 which joins raised portion 53 to a second raised portion 61 shaped to receive and house the integrated circuit package 34. A third raised portion 63 is shaped to receive and house the switch 47. Raised portion 63 is bordered by a flange 65 which is connected on two sides to raised portion 61. Raised portion 63 has an opening 67 to provide access to the lever on switch 47 after the PC card 30 has been encapsulated. Flanges 55 and 65 contact and support substrate 32 in the mold. Cover 28 preferably is a metallic element (or metallic coated element) and attached to the internal ground (not shown) of the substrate 32 (e.g., by being located on a metallized pad). Upper cover 28, which is identical to lower cover 28, is placed over substrate 32, connector 41, electrical contacts 51, integrated circuit package 34 and switch 47 such that connector 41, electrical contacts 51, integrated circuit package 34 and switch 47 are housed by the upper and lower covers 28 and the covers form a seal with the substrate upper surface 57 and lower surface 59 and inside surfaces of the mold platens. Contact of the inside surfaces of the mold platens with the outer surfaces of the raised portions 63 prevents fluid molding compound from entering openings 67. One of ordinary skill in the art will recognize that it is equivalent and within the scope of the claims to place the lower and upper covers on the substrate and connector, then place that assembly in the mold cavity. Upper platen 29 is aligned over lower platen 23 so that mold cavity 25 is formed surrounding all of lower and upper covers 28, and substrate 32. FIG. 19 shows the lower cover, upper cover and substrate located between mold platens 23 and 29, which are employed in the transfer molding operation.

The fluid molding compound passes into mold cavity 25 and flows over flanges 55 and 65 of upper cover 28 and under flanges 55 and 65 of lower cover 28 to encapsulate the flanges of the covers and form ribs 69 and 71 in the PC card over the flanges that are integral with the encapsulant 39. The molding compound forms a seal with the upper and lower covers. The molding compound hardens into encapsulant 39 that surrounds the top and bottom covers 28. After the molded body 39 is hardened, the raised portions 53, 61, and 63 of the covers 28 are exposed on the top and bottom of the encapsulant 39 as a result of being in contact with the surfaces of the top and bottom mold platens (FIG. 19).

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

The invention claimed is:

1. A transfer-molded PC card standard or small form factor card electronic package, comprising:

a substrate having an integrated circuit package thereon and an electrical connector along a side of the substrate;

an upper cover over at least a portion of the substrate and the electrical connector;

a lower cover over at least a portion of the substrate and the electrical connector;

a transfer-molded encapsulant covering the substrate and a portion of the upper cover and the lower cover; and wherein the portion of the upper cover and the lower cover covered by the encapsulant comprises a first flange attached to a portion of a periphery of the upper cover and a second flange attached to a portion of a periphery of the lower cover.

2. The transfer-molded PC card standard or small form factor card electronic package of claim 1 wherein the first flange is in contact with a first surface of the substrate to form a seal between the upper cover and the substrate and the second flange is in contact with a second surface of the substrate to form a seal between the lower cover and the substrate.

3. The transfer-molded PC card standard or small form factor card electronic package of claim 2 further comprising a switch on the substrate wherein the upper cover comprises a first raised portion over the electrical connector with a first flange around a portion of a periphery of the first raised portion and a second raised portion over the switch with a second flange around a portion of a periphery of the second raised portion.

4. The transfer-molded PC card standard or small form factor card electronic package of claim 3 wherein the portion of the upper cover covered by the encapsulant comprises the first flange and the second flange.

5. The transfer-molded PC card standard or small form factor card electronic package of claim 3 wherein the lower cover comprises a raised portion over the electrical connector with a flange around a portion of a periphery of the raised portion of the lower cover.

6. The transfer-molded PC card standard or small form factor card electronic package of claim 3 wherein the second raised portion has an opening therethrough to expose the switch.

\* \* \* \* \*